United States Patent
Okamoto et al.

(10) Patent No.: US 7,838,919 B2
(45) Date of Patent: Nov. 23, 2010

(54) CAPACITOR STRUCTURE

(75) Inventors: Kiyomi Okamoto, Nara (JP); Tetsurou Sugioka, Kyoto (JP); Kazuki Adachi, Kyoto (JP)

(73) Assignee: Panasonic Corporation, Osaka (JP)

( * ) Notice: Subject to any disclaimer, the term of this patent is extended or adjusted under 35 U.S.C. 154(b) by 87 days.

(21) Appl. No.: 12/056,674

(22) Filed: Mar. 27, 2008

(65) Prior Publication Data

US 2008/0239619 A1    Oct. 2, 2008

(30) Foreign Application Priority Data

Mar. 29, 2007  (JP)  ............... 2007-087471
Feb. 26, 2008  (JP)  ............... 2008-044295

(51) Int. Cl.
  H01L 21/8242  (2006.01)
  H01L 27/108  (2006.01)
  H01G 4/33  (2006.01)

(52) U.S. Cl. .............. 257/307; 257/308; 257/535; 257/E27.088; 257/E27.089; 257/E21.012

(58) Field of Classification Search ............... 438/253, 438/396, FOR. 220, FOR. 207, FOR. 430; 257/307–309, 311, 534, 535, E27.088, E27.089, 257/E21.012

See application file for complete search history.

(56) References Cited

U.S. PATENT DOCUMENTS

| | | | |
|---|---|---|---|
| 4,571,543 A * | 2/1986 | Raymond et al. | ........... 324/425 |
| 5,583,359 A | 12/1996 | Ng et al. | |
| 5,939,766 A * | 8/1999 | Stolmeijer et al. | .......... 257/534 |
| 5,978,206 A | 11/1999 | Nishimura et al. | |
| 6,037,621 A | 3/2000 | Wilson | |
| 6,385,033 B1 * | 5/2002 | Javanifard et al. | ........ 361/306.2 |
| 6,410,955 B1 | 6/2002 | Baker et al. | |
| 6,411,492 B1 | 6/2002 | Kar-Roy et al. | |
| 6,445,056 B2 | 9/2002 | Nakashima | |
| 6,480,992 B1 * | 11/2002 | Runyon | ....................... 716/10 |
| 6,542,351 B1 * | 4/2003 | Kwang | ....................... 361/303 |
| 6,653,681 B2 * | 11/2003 | Appel | ....................... 257/307 |
| 6,661,079 B1 * | 12/2003 | Bikulcius | ..................... 257/532 |
| 6,737,698 B1 | 5/2004 | Paul et al. | |
| 6,743,671 B2 | 6/2004 | Hu et al. | |
| 6,806,529 B1 * | 10/2004 | Hopper et al. | ............... 257/314 |
| 6,897,511 B2 | 5/2005 | Marotta | |
| 6,903,402 B2 * | 6/2005 | Miyazawa | ................... 257/296 |
| 7,022,581 B2 * | 4/2006 | Harris et al. | ................ 438/396 |

(Continued)

FOREIGN PATENT DOCUMENTS

JP    04-268756    9/1992

(Continued)

Primary Examiner—George Fourson
(74) Attorney, Agent, or Firm—McDermott Will & Emery LLP (57) ABSTRACT

The capacitor structure includes a first electrode having a plurality of teeth protruding in a comb shape from an electrode base of a first electrode line and a second electrode having a plurality of teeth protruding in a comb shape from an electrode base of a second electrode line, both formed in a first wiring layer. The first and second electrodes face each other with their teeth interdigitated with each other via a dielectric. At least one of the teeth of the first electrode is electrically connected with a third electrode line formed in a second wiring layer.

24 Claims, 9 Drawing Sheets

U.S. PATENT DOCUMENTS

| | | |
|---|---|---|
| 7,126,809 B2 | 10/2006 | Iioka et al. |
| 7,135,366 B2 * | 11/2006 | Rotella .................. 438/238 |
| 7,485,914 B2 * | 2/2009 | Huang et al. ............ 257/309 |
| 7,635,888 B2 * | 12/2009 | Harris et al. ............ 257/307 |
| 2002/0024087 A1 | 2/2002 | Aton |
| 2002/0047154 A1 | 4/2002 | Sowlati et al. |
| 2003/0058693 A1 | 3/2003 | Marotta |
| 2004/0222494 A1 | 11/2004 | Laws |
| 2005/0133848 A1 * | 6/2005 | Rotella .................. 257/307 |
| 2006/0024905 A1 * | 2/2006 | He et al. ................ 438/396 |
| 2006/0208339 A1 * | 9/2006 | Iioka et al. ............. 257/532 |
| 2008/0173981 A1 * | 7/2008 | Chinthakindi et al. ..... 257/535 |

FOREIGN PATENT DOCUMENTS

| | | |
|---|---|---|
| JP | 2700959 | 9/1992 |
| JP | 07-202123 | 8/1995 |

* cited by examiner

CAPACITOR STRUCTURE

CROSS-REFERENCE TO RELATED APPLICATIONS

This application claims priority under 35 U.S.C. §119 on Patent Application No. 2007-087471 filed in Japan on Mar. 29, 2007 and Patent Application No. 2008-044295 filed in Japan on Feb. 26, 2008, the entire contents of which are hereby incorporated by reference.

BACKGROUND OF THE INVENTION

1. Field of the Invention

The present invention relates to a capacitor structure formed in an integrated circuit on a semiconductor substrate.

2. Description of Related Art

As a conventional example of capacitor structure formed in an integrated circuit on a semiconductor substrate, an interdigital capacitor structure is known in which a pair of opposing electrodes in the shape of a comb are placed with their teeth interdigitated with each other. In this capacitor structure, capacitances are respectively formed between the corresponding teeth. In other words, since the surface area of the opposing electrodes increases, a large-capacity capacitor can be obtained in the same area compared with a simple parallel plate capacitor (see Japanese Laid-Open Patent Publication No. 4-268756 (page 3, FIG. 1), for example).

However, in the conventional capacitor structure described above, the capacitance is formed in the tooth portions of the comb electrodes, not in the base line portions thereof. Therefore, the capacitance may include an inductance component and an electric resistance component, although minute in quantity, between the teeth portions and the base line portions. For this reason, for a capacitor used for the purpose of noise removal between the two electrodes, such as a bypass capacitor, for example, the noise attenuation characteristic may not be sufficient in a high-frequency range. In view of this, with the trend toward finer and faster integrated circuits, improvement in capacitor characteristics has become necessary.

SUMMARY OF THE INVENTION

An object of the present invention is providing a capacitor structure in which the parasitic inductance component and the parasitic resistance component are smaller than in the conventional ones to exhibit satisfactory high-frequency characteristics in about the same area as that in the conventional ones.

The capacitor structure of the present invention is a capacitor structure formed on a semiconductor substrate, including: first and second electrode lines formed in a first wiring layer; a first electrode having a plurality of teeth protruding in a comb shape from an electrode base of the first electrode line; and a second electrode having a plurality of teeth protruding in a comb shape from an electrode base of the second electrode line, wherein the first and second electrodes face each other with their teeth interdigitated with each other via a dielectric, and at least one of the teeth of the first electrode is electrically connected with a third electrode line formed in a second wiring layer different from the first wiring layer.

In the capacitor structure described above, the first comb electrode formed at the first electrode line in the first wiring layer is electrically connected with the third electrode line in the second wiring layer different from the first wiring layer. A capacitor will therefore be formed over the route of the current flow in the first electrode from the first electrode line to the third electrode line. Hence, the parasitic inductance component and the parasitic resistance component can be reduced compared with the conventional capacitor structures.

Alternatively, the capacitor structure of the present invention is a capacitor structure formed on a semiconductor substrate, including: first and second electrode lines formed in a first wiring layer; a first electrode having a spiral portion extending from the first electrode line; and a second electrode having a spiral portion extending from the second electrode line, wherein the first and second electrodes face each other with the spiral portions intertwined with each other via a dielectric, and the spiral portion of the first electrode is electrically connected with a third electrode line formed in a second wiring layer different from the first wiring layer.

In the capacitor structure described above, the spiral portion of the first electrode extending from the first electrode line in the first wiring layer is electrically connected with the third electrode line in the second wiring layer different from the first wiring layer. A capacitor will therefore be formed over the route of the current flow in the first electrode from the first electrode line to the third electrode line. Hence, the parasitic inductance component and the parasitic resistance component can be reduced compared with the conventional capacitor structures.

As described above, according to the present invention, in which a capacitor is formed over the route of a current flow in an electrode, the parasitic inductance component and the parasitic resistance component can be made smaller than in the conventional capacitor structures. It is therefore possible to suppress the characteristic degradation due to the parasitic inductance component and the parasitic resistance component and thus substantially improve the high-frequency characteristics in about the same area as that in the conventional structures. In this way, a capacitor high in noise bypassing effect in the high-frequency range, for example, can be provided.

DESCRIPTION OF THE PREFERRED EMBODIMENTS

Hereinafter, preferred embodiments of the present invention will be described with reference to the accompanying drawings. It should be noted that the embodiments to follow merely illustrate the invention and are by no means intended to limit the invention, and that such embodiments can be combined and modified freely within the scope of the invention.

Embodiment 1

Figure 1:
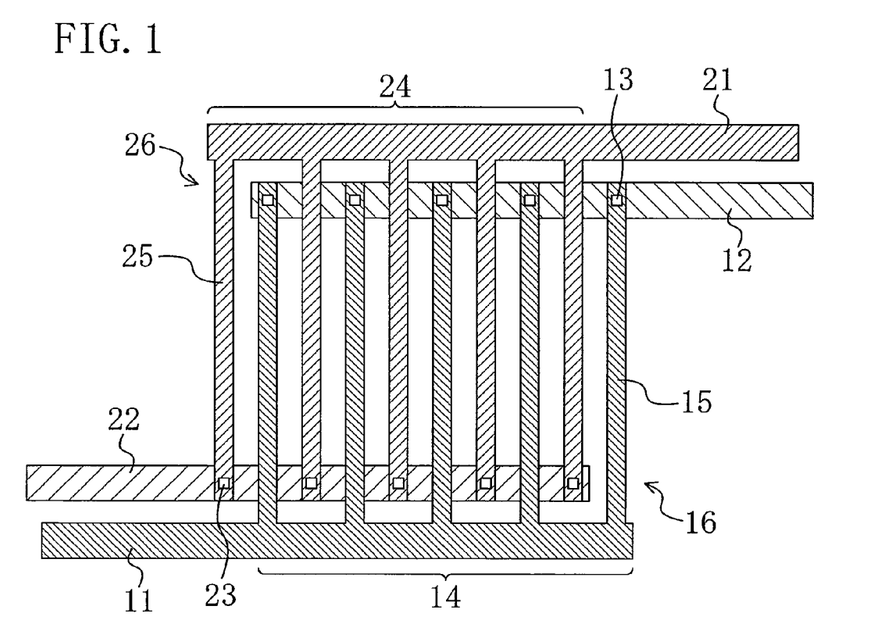
FIG. 1 is a top view of a capacitor structure of Embodiment 1 of the present invention.

FIG. 1 is a top view of a capacitor structure of Embodiment 1 of the present invention formed in an integrated circuit on a semiconductor substrate. Referring to FIG. 1, first and second electrode lines 11 and 21 are formed in an upper wiring layer as the first wiring layer. A first electrode 16, formed at the first electrode line 11, has a plurality of (five in FIG. 1) teeth 15 protruding in a comb shape from an electrode base 14 of the first electrode line 11. A second electrode 26, formed at the second electrode line 21, has a plurality of (five in FIG. 1) teeth 25 protruding in a comb shape from an electrode base 24 of the second electrode line 21. The first and second electrodes 16 and 26 face each other with their teeth 15 and 25 engaged or interdigitated with each other via a dielectric. That is, the first and second electrodes 16 and 26 are interdigitated with each other.

The tip portions of the teeth 15 of the first electrode 16 are electrically connected with a third electrode line 12 formed in a lower wiring layer as the second wiring layer different from the first wiring layer via vias 13. Likewise, the tip portions of the teeth 25 of the second electrode 26 are electrically connected with a fourth electrode line 22 formed in the lower wiring layer via vias 23.

In the capacitor structure of this embodiment configured as shown in FIG. 1, in which the opposing first and second electrodes 16 and 26 are interdigitated with each other, the surface area of the opposing electrodes is large, and thus a large-capacity capacitor can be attained in the same area compared with a simple parallel plate capacitor. Moreover, in this embodiment in which the tip portions of the teeth 15 and 25 of the first and second electrodes 16 and 26 are respectively electrically connected with the third and fourth electrode lines 12 and 22 in the lower wiring layer, a capacitor will be formed over the routes of current flows in the first and second electrodes 16 and 26 (from the first electrode line 11 to the third electrode line 12 and from the second electrode line 21 to the fourth electrode line 22). Thus, the parasitic inductance component and parasitic resistance component of the capacitor can be reduced.

Accordingly, in this embodiment, a large-capacity capacitor small in characteristic degradation due to a parasitic inductance component and a parasitic resistance component can be attained in about the same space as that in the conventional capacitors.

In the configuration of FIG. 1, the tip portions of all the teeth of the opposing electrodes are electrically connected with the electrode lines in the lower wiring layer. The present invention is not limited to this, but at least one tooth may be electrically connected with the corresponding electrode line in the lower wiring layer. With this configuration, also, the parasitic inductance component and parasitic resistance component of the capacitor can be made smaller than those in the conventional structures. Otherwise, portions other than the tip portions of the teeth of the opposing electrodes may be electrically connected with the electrode lines in the lower wiring layer. To ensure more satisfactory capacitor characteristics, however, it is preferred to electrically connect the tip portions of the teeth of the electrodes with the electrode lines as shown in FIG. 1.

Only the teeth of either one of the opposing electrodes, or the first electrode 16, for example, may be electrically connected with the corresponding electrode line in the lower wiring layer. This configuration may be adopted when the second electrode 26 is grounded, for example.

In the configuration of FIG. 1, the first and second electrodes 16 and 26 are formed in the upper wiring layer, while the third and fourth electrode lines 12 and 22 are formed in the lower wiring layer. The hierarchical relationship of the wiring layers in which the electrodes and the electrode lines are formed is not limited to this. For example, the third and fourth electrode lines 12 and 22 may be formed in a wiring layer located above the wiring layer in which the first and second electrodes 16 and 26 are formed. Otherwise, one or more wiring layers may be interposed between the wiring layer in which the first and second electrodes 16 and 26 are formed and the wiring layer in which the third and fourth electrode lines 12 and 22 are formed.

Embodiment 2

Figure 2:
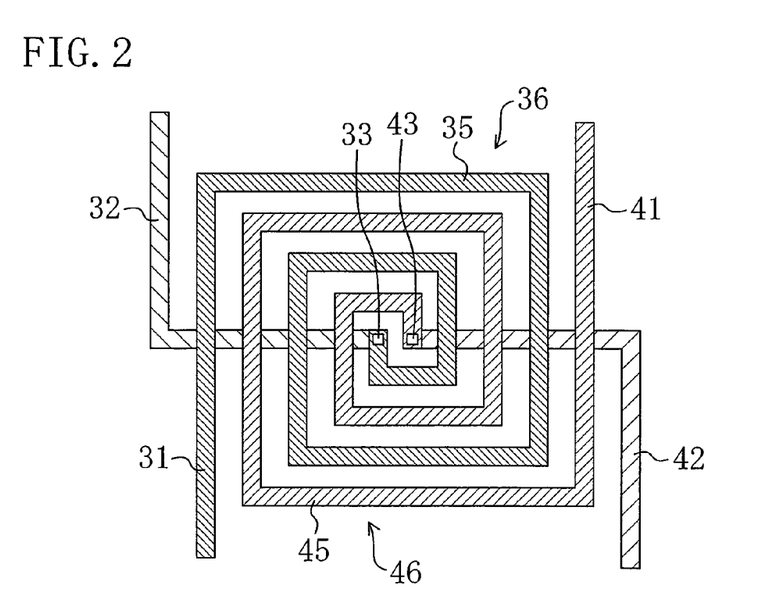
FIG. 2 is a top view of a capacitor structure of Embodiment 2 of the present invention.

FIG. 2 is a top view of a capacitor structure of Embodiment 2 of the present invention formed in an integrated circuit on a semiconductor substrate. The capacitor structure shown in FIG. 2 has spiral electrodes in place of the comb electrodes in the capacitor structure of Embodiment 1 shown in FIG. 1.

Referring to FIG. 2, first and second electrode lines 31 and 41 are formed in an upper wiring layer as the first wiring layer. A first electrode 36, formed at the first electrode line 31, has a spiral portion 35 extending from the first electrode line 31. A second electrode 46, formed at the second electrode line 41, has a spiral portion 45 extending from the second electrode line 41. The first and second electrodes 36 and 46 face each other with the spiral portions 35 and 45 engaged or intertwined with each other via a dielectric.

The tip portion of the spiral portion 35 of the first electrode 36, that is, the center portion of the spiral is electrically connected with a third electrode line 32 formed in a lower wiring layer as the second wiring layer different from the first wiring layer via a via 33. Likewise, the tip portion of the spiral portion 45 of the second electrode 46, that is, the center portion of the spiral is electrically connected with a fourth electrode line 42 formed in the lower wiring layer via a via 43.

In the capacitor structure of this embodiment configured as shown in FIG. 2, in which the opposing first and second electrodes 36 and 46 are placed with the spiral portions 35 and 45 intertwined with each other, the surface area of the opposing electrodes is large, and thus a large-capacity capacitor can be attained in the same area compared with a simple parallel plate capacitor. Moreover, in this embodiment in which the tip portions of the spiral portions 35 and 45 of the first and second electrodes 36 and 46 are respectively electrically connected with the third and fourth electrode lines 32 and 42 in the lower wiring layer, a capacitor will be formed over the routes of current flows in the first and second electrodes 36 and 46 (from the first electrode line 31 to the third electrode line 32 and from the second electrode line 41 to the fourth electrode line 42). Thus, the parasitic inductance component and parasitic resistance component of the capacitor can be reduced.

Accordingly, in this embodiment, as in Embodiment 1, a large-capacity capacitor small in characteristic degradation due to the parasitic inductance component and the parasitic resistance component can be attained in about the same space as that in the conventional capacitors.

In the configuration of FIG. 2, the tip portions of the spiral portions of the opposing electrodes are electrically connected with the electrode lines in the lower wiring layer. The present invention is not limited to this, but portions other than the tip portions of the spiral portions of the opposing electrodes may be electrically connected with the electrode lines in the lower wiring layer. To ensure more satisfactory capacitor characteristics, however, it is preferred to electrically connect the tip portions of the spiral portions of the electrodes with the electrode lines as shown in FIG. 2.

Only the spiral portion of either one of the opposing electrodes, or the first electrode 36, for example, may be electrically connected with the corresponding electrode line in the lower wiring layer. This configuration may be adopted when the second electrode 46 is grounded, for example.

In the configuration of FIG. 2, the first and second electrodes 36 and 46 are formed in the upper wiring layer, while the third and fourth electrode lines 32 and 42 are formed in the lower wiring layer. The hierarchical relationship of the wiring layers in which the electrodes and the electrode lines are formed is not limited to this. For example, the third and fourth electrode lines 32 and 42 may be formed in a wiring layer located above the wiring layer in which the first and second electrodes 36 and 46 are formed. Otherwise, one or more wiring layers may be interposed between the wiring layer in which the first and second electrodes 36 and 46 are formed and the wiring layer in which the third and fourth electrode lines 32 and 42 are formed.

Embodiment 3

Figure 3A:
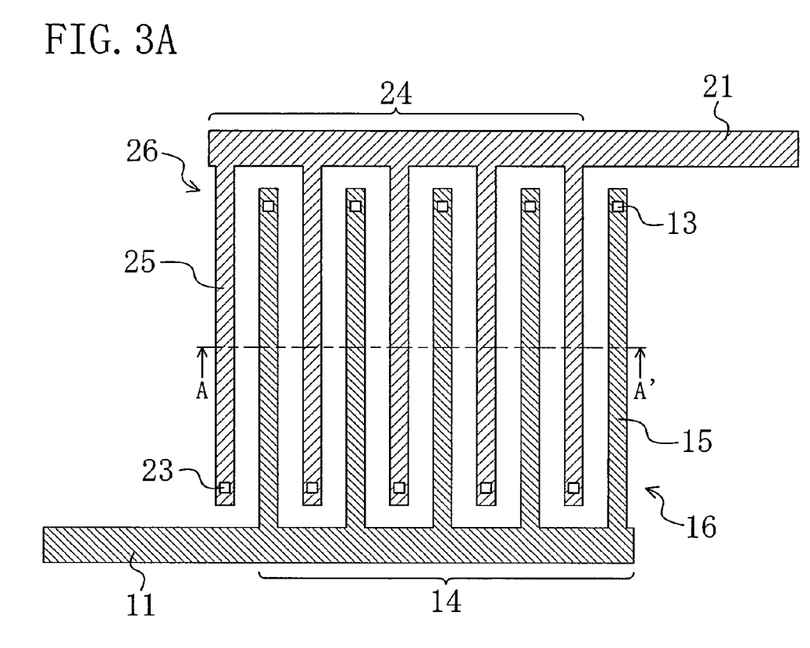
FIGS. 3A and 3B are top views of a capacitor structure of Embodiment 3 of the present invention, respectively showing plane structures in upper and lower wiring layers.
Figure 3B:
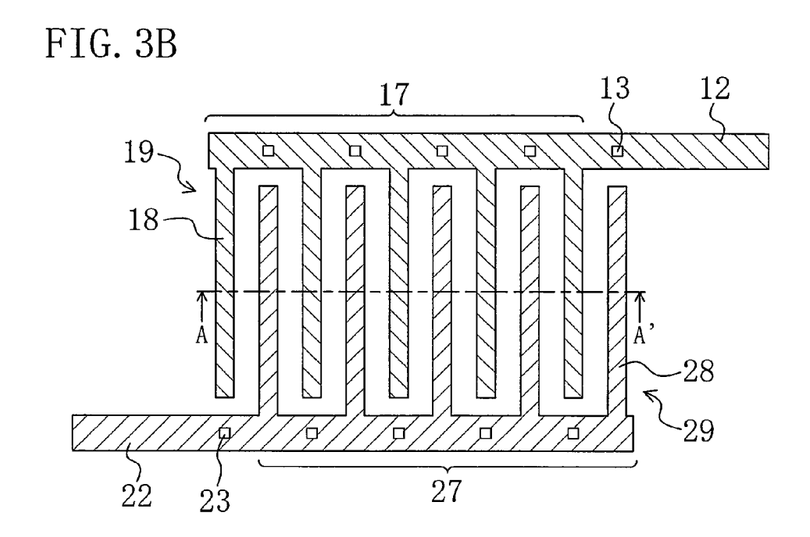
Figure 4:
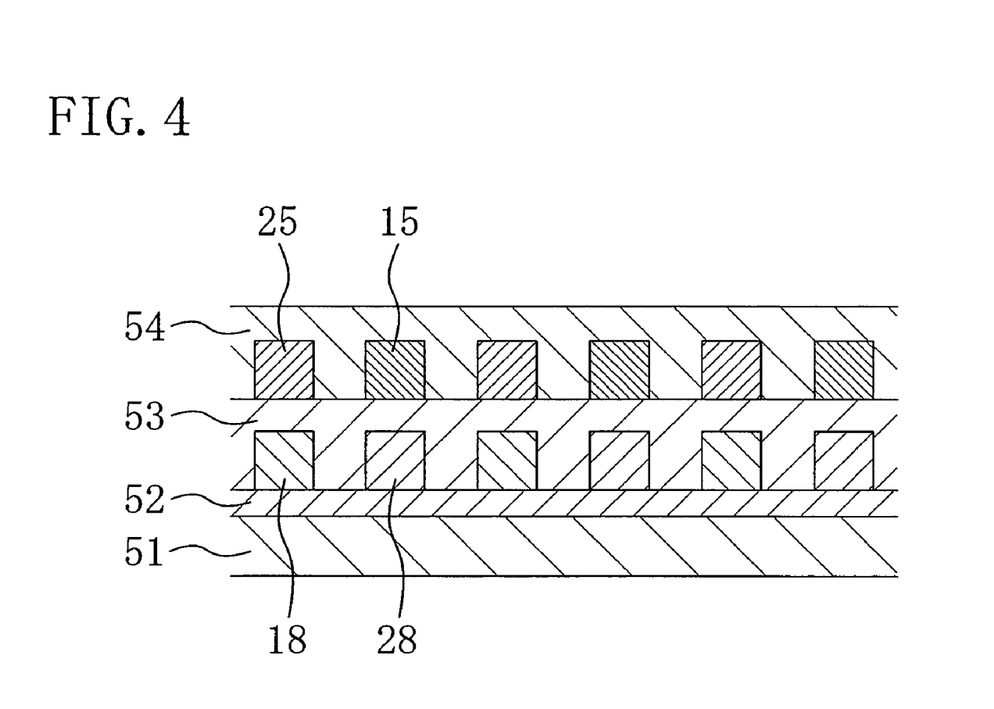
FIG. 4 is a cross-sectional view of the capacitor structure of Embodiment 3 of the present invention.

FIGS. 3A and 3B are top views of a capacitor structure of Embodiment 3 of the present invention formed in an integrated circuit on a semiconductor substrate, respectively showing plane structures of an upper wiring layer and a lower wiring layer. FIG. 4 is a cross-sectional view taken along line A-A' in FIGS. 3A and 3B.

The capacitor structure of FIGS. 3A, 3B and 4 is configured using the capacitor structure of FIG. 1 as the basic configuration so that electrodes also face each other in the lower wiring layer and between the upper and lower wiring layers to form capacitances therebetween.

As shown in FIGS. 3A and 3B, in the upper wiring layer, formed are a first electrode 16 having a plurality of teeth 15 protruding in a comb shape from an electrode base 14 of a first electrode line 11 and a second electrode 26 having a plurality of teeth 25 protruding in a comb shape from an electrode base 24 of a second electrode line 21. The tip portions of the teeth 15 of the first electrode 16 are electrically connected with a third electrode line 12 formed in the lower wiring layer via vias 13. Likewise, the tip portions of the teeth 25 of the second electrode 26 are electrically connected with a fourth electrode line 22 formed in the lower wiring layer via vias 23. The above configuration is substantially the same as the capacitor structure of FIG. 1.

In the lower wiring layer, a third electrode 19 having a plurality of teeth 18 protruding in a comb shape from an electrode base 17 is formed at the third electrode line 12. Likewise, a fourth electrode 29 having a plurality of teeth 28 protruding in a comb shape from an electrode base 27 is formed at the fourth electrode line 22. The third electrode 19 and the fourth electrode 29 face each other with their teeth 18 and 28 engaged or interdigitated with each other via a dielectric. That is, the third and fourth electrodes 19 and 29 are interdigitated with each other.

The first electrode 16 in the upper wiring layer and the third electrode 19 in the lower wiring layer are electrically connected with each other via the vias 13, and the second electrode 26 in the upper wiring layer and the fourth electrode 29 in the lower wiring layer are electrically connected with each other via the vias 23.

In the cross-sectional view of FIG. 4, the reference numeral 51 denotes a semiconductor substrate, 52 an interlayer insulating film, 53 a lower wiring layer and 54 an upper wiring layer. As shown in FIG. 4, the teeth 25 of the second electrode 26 formed in the upper wiring layer 54 face the teeth 18 of the third electrode 19 formed in the lower wiring layer 53. Likewise, the teeth 15 of the first electrode 16 formed in the upper wiring layer 54 face the teeth 28 of the fourth electrode 29 formed in the lower wiring layer 53.

In the capacitor structure of this embodiment configured as shown in FIGS. 3A, 3B and 4, which uses the capacitor structure of FIG. 1 as the basic configuration, the function and effect described in Embodiment 1 can be obtained. Moreover, since the electrodes face each other in the lower wiring layer and between the upper and lower wiring layers in addition to in the upper wiring layer, a capacitance C2 of the opposing electrodes in the lower wiring layer and a capacitance C3 of the opposing electrodes between the upper and lower wiring layers are formed in addition to the capacitance C1 of the opposing electrodes in the upper wiring layer. Thus, the capacitor structure of this embodiment, which can hold the capacitance of (C1+C2+C3), permits formation of a capacitor with a further large capacity, compared with Embodiment 1, over the routes of current flows in the electrodes.

One of the opposing electrodes in the lower wiring layer may be omitted. For example, only the third electrode 19 may be formed omitting the fourth electrode 29. In this case, no capacitance will be formed in the lower wiring layer, but a capacitance will be formed between the upper and lower wiring layers with the third electrode 19 facing the second electrode 26. In this case, also, the fourth electrode line 22 may be omitted.

In the configuration of FIGS. 3A, 3B and 4, all the teeth of the electrodes in the upper wiring layer have their opposing teeth in the lower wiring layer. The present invention is not limited to this, but at least one tooth of the electrodes in the upper wiring layer may have its opposing tooth in the lower wiring layer.

Embodiment 4

Figure 5A:
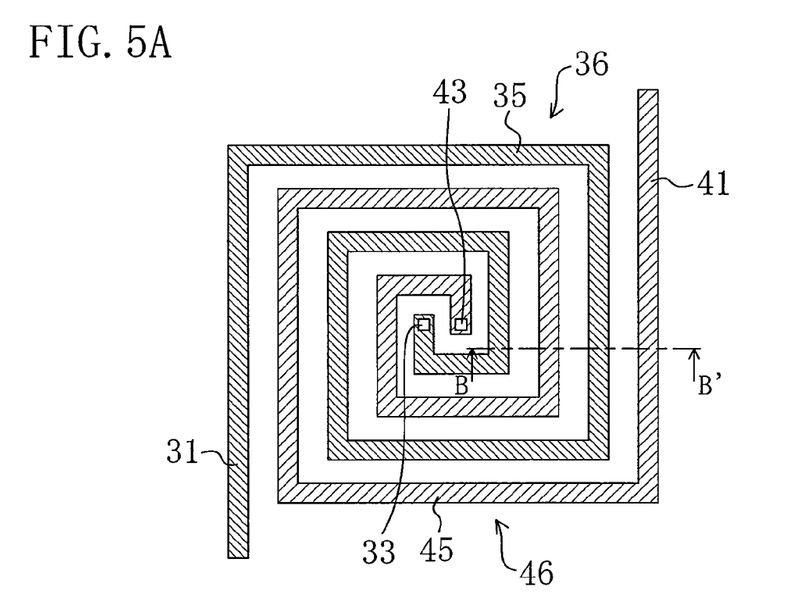
FIGS. 5A and 5B are top views of a capacitor structure of Embodiment 4 of the present invention, respectively showing plane structures in upper and lower wiring layers.
Figure 5B:
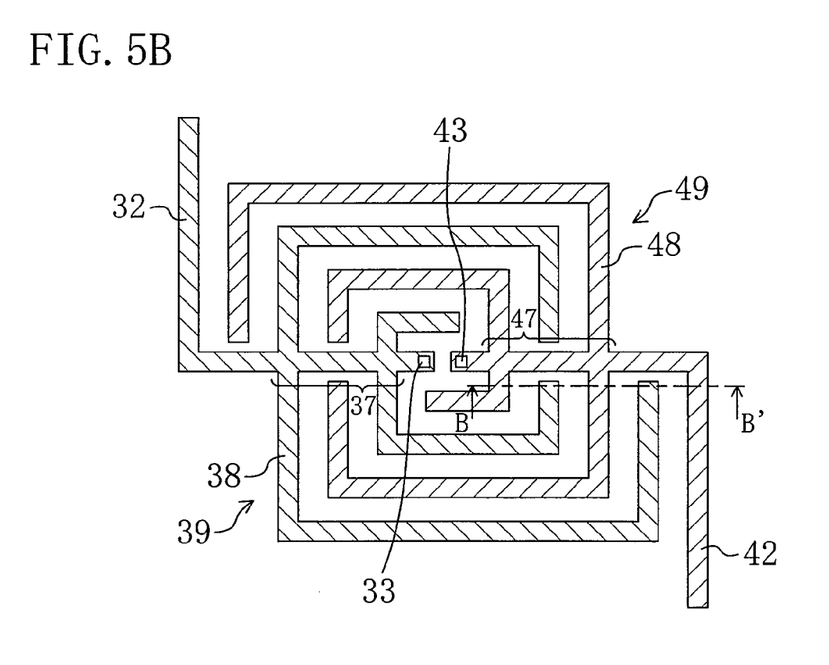
Figure 6:
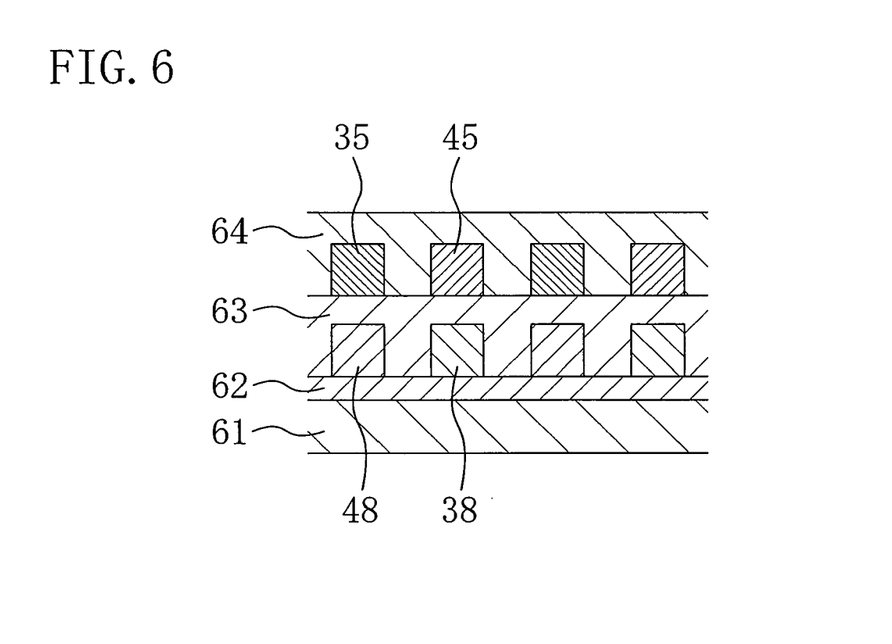
FIG. 6 is a cross-sectional view of the capacitor structure of Embodiment 4 of the present invention.

FIGS. 5A and 5B are top views of a capacitor structure of Embodiment 4 of the present invention formed in an integrated circuit on a semiconductor substrate, respectively showing plane structures of an upper wiring layer and a lower wiring layer. FIG. 6 is a cross-sectional view taken along line B-B' in FIGS. 5A and 5B.

The capacitor structure of FIGS. 5A, 5B and 6 is configured using the capacitor structure of FIG. 2 as the basic configuration so that electrodes also face each other in the lower wiring layer and between the upper and lower wiring layers to form capacitances therebetween.

As shown in FIGS. 5A and 5B, in the upper wiring layer, formed are a first electrode 36 having a spiral portion 35 extending from a first electrode line 31 and a second electrode 46 having a spiral portion 45 extending from a second electrode line 41. The tip portion of the spiral portion 35 of the first electrode 36 is electrically connected with a third electrode line 32 formed in the lower wiring layer via a via 33. Likewise, the tip portion of the spiral portion 45 of the second electrode 46 is electrically connected with a fourth electrode line 42 formed in the lower wiring layer via a via 43. The above configuration is substantially the same as the capacitor structure of FIG. 2.

In the lower wiring layer, a third electrode 39 having a plurality of protrusions 38 protruding from an electrode base 37 is formed at the third electrode line 32. Likewise, a fourth electrode 49 having a plurality of protrusions 48 protruding from an electrode base 47 is formed at the fourth electrode line 42. The third electrode 39 and the fourth electrode 49 face each other with their protrusions 38 and 48 engaged or interdigitated with each other via a dielectric.

The first electrode 36 in the upper wiring layer and the third electrode 39 in the lower wiring layer are electrically connected with each other via the via 33, and the second electrode 46 in the upper wiring layer and the fourth electrode 49 in the lower wiring layer are electrically connected with each other via the via 43.

In the cross-sectional view of FIG. 6, the reference numeral 61 denotes a semiconductor substrate, 62 an interlayer insulating film, 63 a lower wiring layer and 64 an upper wiring layer. As shown in FIG. 6, the spiral portion 35 of the first electrode 36 formed in the upper wiring layer 64 faces the protrusions 48 of the fourth electrode 49 formed in the lower wiring layer 63. Likewise, the spiral portion 45 of the second electrode 46 formed in the upper wiring layer 64 faces the protrusions 38 of the third electrode 39 formed in the lower wiring layer 63.

In the capacitor structure of this embodiment configured as shown in FIGS. 5A, 5B 5 and 6, which uses the capacitor structure of FIG. 2 as the basic configuration, the function and effect described in Embodiment 2 can be obtained. Moreover, since the electrodes face each other in the lower wiring layer and between the upper and lower wiring layers in addition to in the upper wiring layer, a capacitance C2$a$ of the opposing electrodes in the lower wiring layer and a capacitance C3$a$ of the opposing electrodes between the upper and lower wiring layers are formed in addition to the capacitance C1$a$ of the opposing electrodes in the upper wiring layer. Thus, the capacitor structure of this embodiment, which can hold the capacitance of (C1$a$+C2$a$+C3$a$), permits formation of a capacitor with a further large capacity, compared with Embodiment 2, over the routes of current flows in the electrodes.

One of the opposing electrodes in the lower wiring layer may be omitted. For example, only the third electrode 39 may be formed omitting the fourth electrode 49. In this case, no capacitance will be formed in the lower wiring layer, but a capacitance will be formed between the upper and lower wiring layers with the third electrode 39 facing the second electrode 46. In this case, also, the fourth electrode line 42 may be omitted.

In the configuration of FIGS. 5A, 5B and 6, the protrusions in the lower wiring layer face roughly the entire spiral portions of the electrodes in the upper wiring layer. The present invention is not limited to this, but at least part of the spiral portions may have its opposing protrusion or protrusions in the lower wiring layer.

Embodiment 5

In Embodiment 5 of the present invention, vias are formed on top or bottom of the teeth 15 and 25 of the first and second electrodes 16 and 26 in the capacitor structure of Embodiment 1, or vias are formed on top or bottom of the spiral portions 35 and 45 of the first and second electrodes 36 and 46 in the capacitor structure of Embodiment 2.

Figure 7:
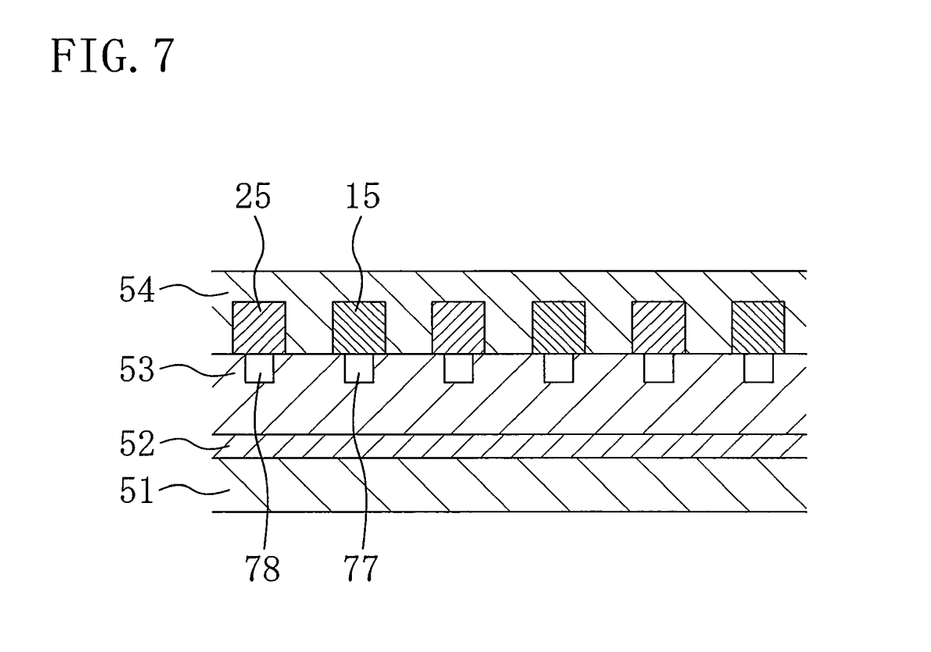
FIG. 7 is a cross-sectional view of a capacitor structure of Embodiment 5 of the present invention.

FIG. 7 is a cross-sectional view of a capacitor structure of this embodiment. The top view thereof is the same as FIG. 1. As shown in FIG. 7, vias 77 are formed on bottom of the respective teeth 15 of the first electrode 16, and vias 78 are formed on bottom of the respective teeth 25 of the second electrode 26.

In the capacitor structure of this embodiment shown in FIG. 7, a capacitance is formed, not only between the opposing electrodes in the upper wiring layer, but also between the vias placed on bottom of the electrodes. Thus, the capacitor structure of this embodiment permits formation of a capacitor with a further large capacity, compared with Embodiment 1 or 2, over the routes of current flows in the electrodes.

Embodiment 6

Figure 8A:
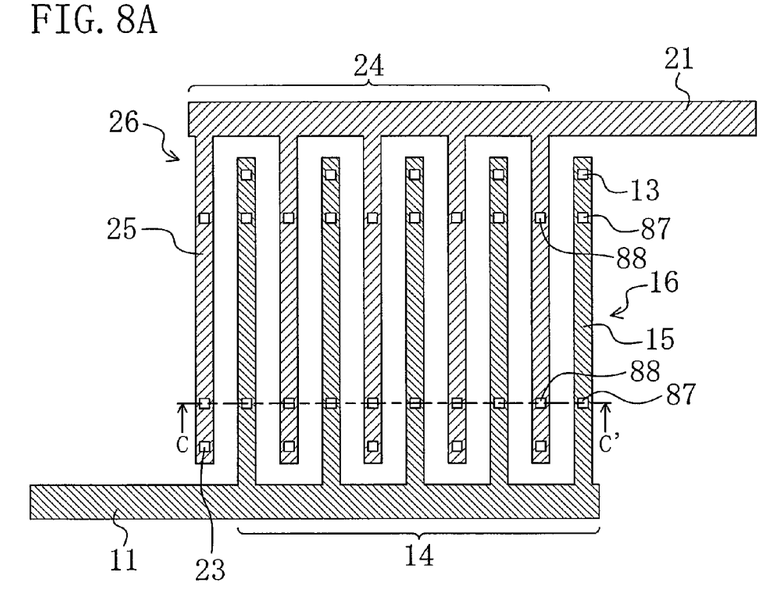
FIGS. 8A and 8B are top views of a capacitor structure of Embodiment 6 of the present invention, respectively showing plane structures in upper and lower wiring layers.
Figure 8B:
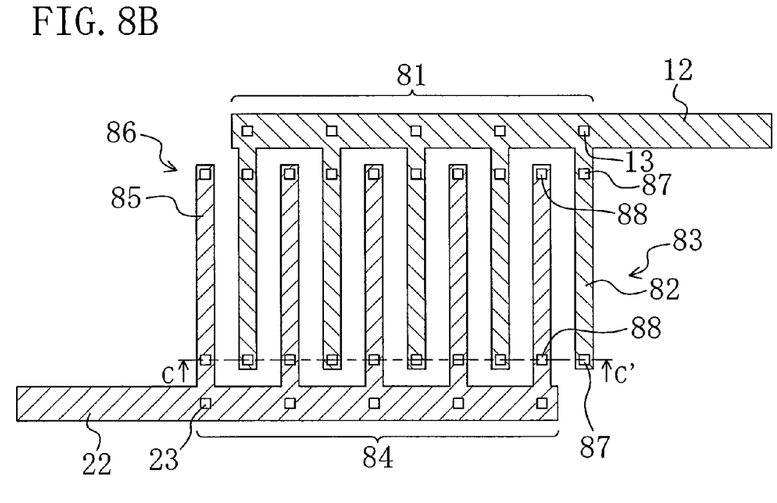
Figure 9:
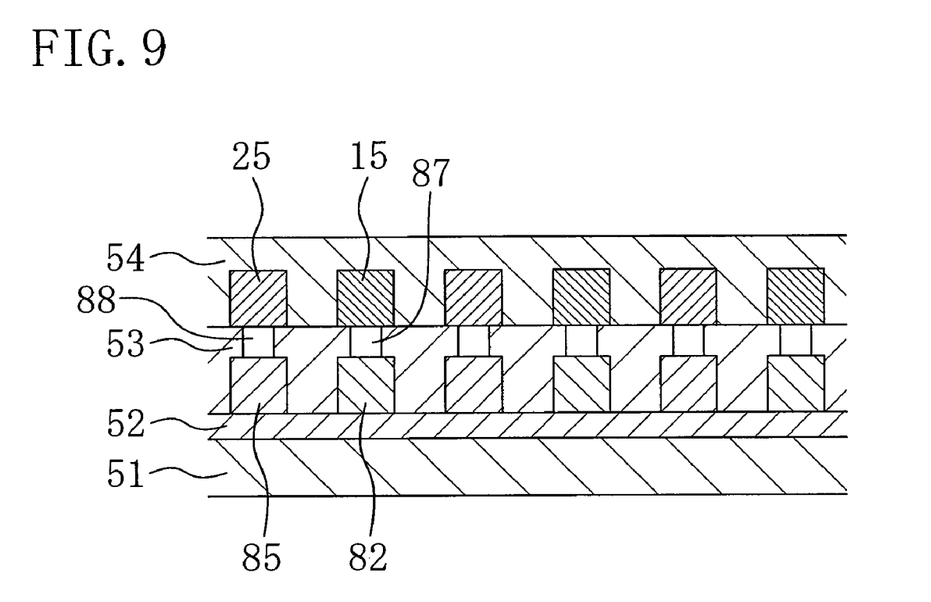
FIG. 9 is a cross-sectional view of the capacitor structure of Embodiment 6 of the present invention.

FIGS. 8A and 8B are top views of a capacitor structure of Embodiment 6 of the present invention formed in an integrated circuit on a semiconductor substrate, respectively showing plane structures of an upper wiring layer and a lower wiring layer. FIG. 9 is a cross-sectional view taken along line C-C' in FIGS. 8A and 8B.

The capacitor structure shown in FIGS. 8A, 8B and 9 is configured using the capacitor structure of FIG. 1 as the basic configuration so that electrodes and vias also face each other in the lower wiring layer to form capacitances therebetween.

As shown in FIGS. 8A and 8B, in the upper wiring layer, formed are a first electrode 16 having a plurality of teeth 15 protruding in a comb shape from an electrode base 14 of a first electrode line 11 and a second electrode 26 having a plurality of teeth 25 protruding in a comb shape from an electrode base 24 of a second electrode line 21. The tip portions of the teeth 15 of the first electrode 16 are electrically connected with a third electrode line 12 formed in the lower wiring layer via vias 13. Likewise, the tip portions of the teeth 25 of the second electrode 26 are electrically connected with a fourth electrode line 22 formed in the lower wiring layer via vias 23. The above configuration is substantially the same as the capacitor structure of FIG. 1.

In the lower wiring layer, a third electrode 83 having a plurality of teeth 82 protruding in a comb shape from an electrode base 81 is formed at the third electrode line 12. Likewise, a fourth electrode 86 having a plurality of teeth 85 protruding in a comb shape from an electrode base 84 is formed at the fourth electrode line 22. The third electrode 83 and the fourth electrode 86 face each other with their teeth 82 and 85 engaged or interdigitated with each other via a dielectric. That is, the third and fourth electrodes 83 and 86 are interdigitated with each other.

Vias 87 are formed for electrically connecting the teeth 15 of the first electrode 16 in the upper wiring layer with the teeth 82 of the third electrode 83 in the lower wiring layer. Likewise, vias 88 are formed for electrically connecting the teeth 25 of the second electrode 26 in the upper wiring layer with the teeth 85 of the fourth electrode 86 in the lower wiring layer.

In the cross-sectional view of FIG. 9, the reference numeral 51 denotes a semiconductor substrate, 52 an interlayer insulating film, 53 a lower wiring layer and 54 an upper wiring layer. As shown in FIG. 9, the teeth 25 of the second electrode 26 formed in the upper wiring layer 54 are electrically connected with the teeth 85 of the fourth electrode 86 formed in the lower wiring layer 53 via the vias 88. Likewise, the teeth 15 of the first electrode 16 formed in the upper wiring layer 54 are electrically connected with the teeth 82 of the third electrode 83 formed in the lower wiring layer 53 via the vias 87.

In the capacitor structure of this embodiment configured as shown in FIGS. 8A, 8B and 9, which uses the capacitor structure of FIG. 1 as the basic configuration, the function and effect described in Embodiment 1 can be obtained. Moreover, since the electrodes and the vias respectively face each other in the lower wiring layer in addition to the electrodes in the upper wiring layer, a capacitance C4 of the opposing electrodes and a capacitance C5 of the opposing vias in the lower wiring layer are formed in addition to the capacitance C1 of the opposing electrodes in the upper wiring layer. Thus, the capacitor structure of this embodiment, which can hold the capacitance of (C1+C4+C5), permits formation of a capacitor with a further large capacity, compared with Embodiment 1, over the routes of current flows in the electrodes.

In the configuration of FIGS. 8A, 8B and 9, vias are formed for the respective teeth of the electrodes in the upper wiring layer to connect these teeth with the teeth of the electrodes in the lower wiring layer. The present invention is not limited to this, but at least one tooth may be connected with its opposing tooth in the lower wiring layer via a via.

Embodiment 7

Figure 10A:
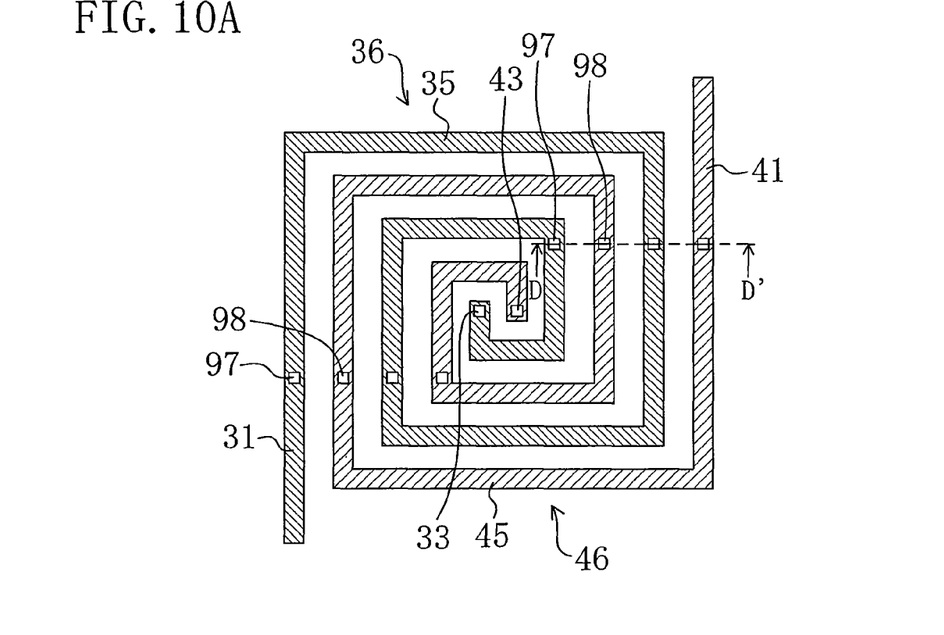
FIGS. 10A and 10B are top views of a capacitor structure of Embodiment 7 of the present invention, respectively showing plane structures in upper and lower wiring layers.
Figure 10B:
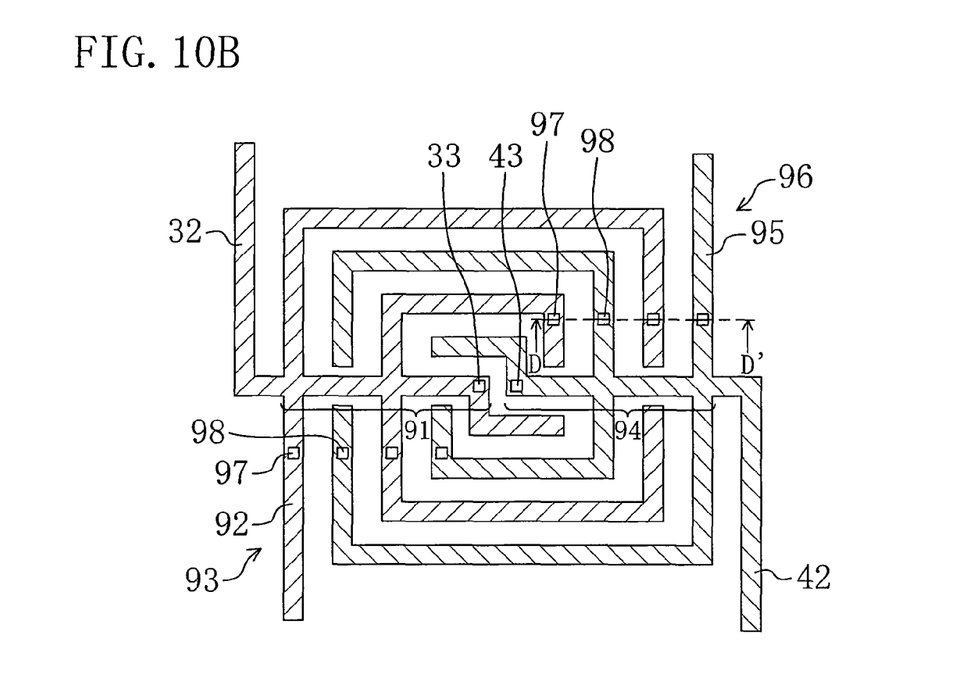
Figure 11:
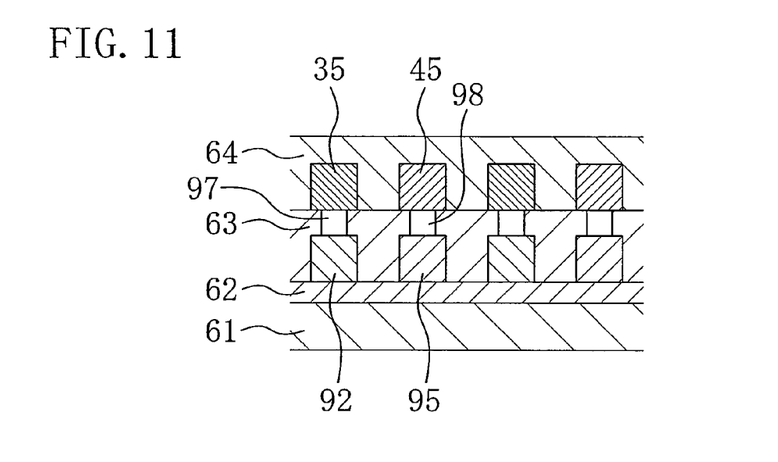
FIG. 11 is a cross-sectional view of the capacitor structure of Embodiment 7 of the present invention.

FIGS. 10A and 10B are top views of a capacitor structure of Embodiment 7 of the present invention formed in an integrated circuit on a semiconductor substrate, respectively showing plane structures of an upper wiring layer and a lower wiring layer. FIG. 11 is a cross-sectional view taken along line D-D' in FIGS. 10A and 10B.

The capacitor structure of FIGS. 10A, 10B and 11 is configured using the capacitor structure of FIG. 2 as the basic configuration so that electrodes and vias also face each other in the lower wiring layer to form capacitances therebetween.

As shown in FIGS. 10A and 10B, in the upper wiring layer, formed are a first electrode 36 having a spiral portion 35 extending from a first electrode line 31 and a second electrode 46 having a spiral portion 45 extending from a second electrode line 41. The tip portion of the spiral portion 35 of the first electrode 36 is electrically connected with a third electrode line 32 formed in the lower wiring layer via a via 33. Likewise, the tip portion of the spiral portion 45 of the second electrode 46 is electrically connected with a fourth electrode line 42 formed in the lower wiring layer via a via 43. The above configuration is substantially the same as the capacitor structure of FIG. 2.

In the lower wiring layer, a third electrode 93 having a plurality of protrusions 92 protruding from an electrode base 91 is formed at the third electrode line 32. Likewise, a fourth electrode 96 having a plurality of protrusions 95 protruding from an electrode base 94 is formed at the fourth electrode line 42. The third electrode 93 and the fourth electrode 96 face each other with the protrusions 92 and 95 engaged or interdigitated with each other via a dielectric.

Vias 97 are formed for electrically connecting the spiral portion 35 of the first electrode 36 in the upper wiring layer with the protrusions 92 of the third electrode 93 in the lower wiring layer. Likewise, vias 98 are formed for electrically connecting the spiral portion 45 of the second electrode 46 in the upper wiring layer with the protrusions 95 of the fourth electrode 96 in the lower wiring layer.

In the cross-sectional view of FIG. 11, the reference numeral 61 denotes a semiconductor substrate, 62 an interlayer insulating film, 63 a lower wiring layer and 64 an upper wiring layer. As shown in FIG. 11, the spiral portion 35 of the first electrode 36 formed in the upper wiring layer 64 is electrically connected with the protrusions 92 of the third electrode 93 formed in the lower wiring layer 63 via the vias 97. Likewise, the spiral portion 45 of the second electrode 46 formed in the upper wiring layer 64 is electrically connected with the protrusions 95 of the fourth electrode 96 formed in the lower wiring layer 63 via the vias 98.

In the capacitor structure of this embodiment configured as shown in FIGS. 10A, 10B and 11, which uses the capacitor structure of FIG. 2 as the basic configuration, the function and effect described in Embodiment 2 can be obtained. Moreover, since the electrodes and the vias respectively face each other in the lower wiring layer in addition to the electrodes in the upper wiring layer, a capacitance C4$a$ of the opposing electrodes and a capacitance C5$a$ of the opposing vias in the lower wiring layer are formed in addition to the capacitance C1$a$ of the opposing electrodes in the upper wiring layer. Thus, the capacitor structure of this embodiment, which can hold the capacitance of (C1$a$+C4$a$+C5$a$), permits formation of a capacitor with a further large capacity, compared with Embodiment 2, over the routes of current flows in the electrodes.

Embodiment 8

Figure 12:
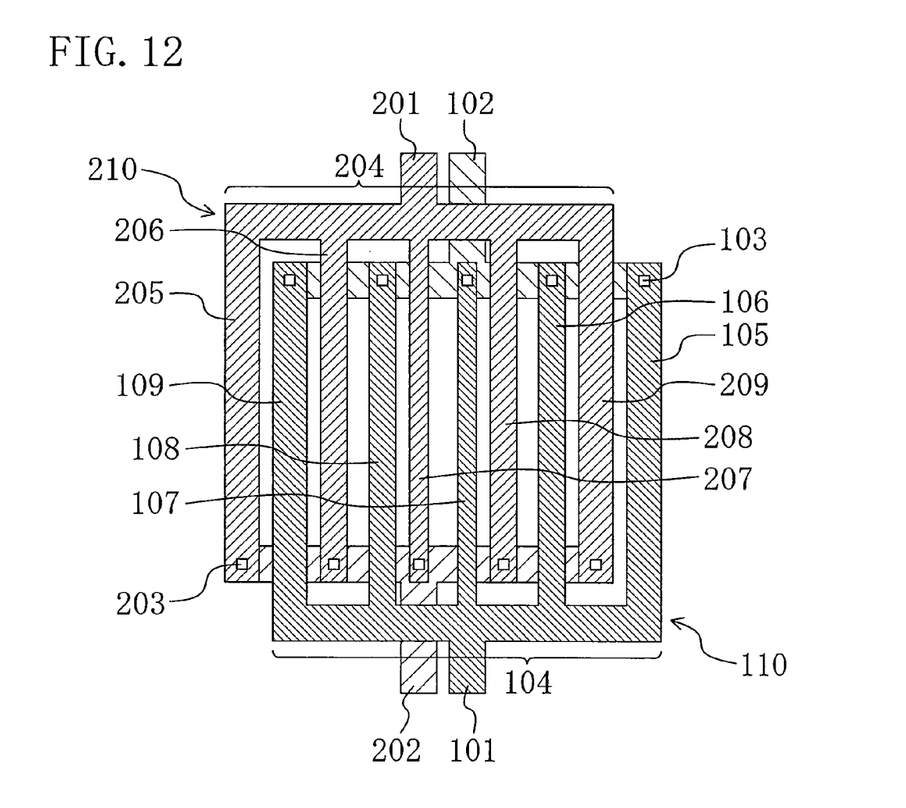
FIG. 12 is a top view of a capacitor structure of Embodiment 8 of the present invention.

FIG. 12 is a top view of a capacitor structure of Embodiment 8 of the present invention formed in an integrated circuit on a semiconductor substrate. Referring to FIG. 12, first and second electrode lines 101 and 201 are formed in an upper wiring layer as the first wiring layer. A first electrode 110, formed at the first electrode line 101, has a plurality of teeth 105, 106, 107, 108 and 109 protruding in a comb shape from an electrode base 104 of the first electrode line 101. Likewise, a second electrode 210, formed at the second electrode line 201, has a plurality of teeth 205, 206, 207, 208 and 209 protruding in a comb shape from an electrode base 204 of the second electrode line 201. The first and second electrodes 110 and 210 face each other with their teeth 105 to 109 and 205 to 209 engaged or interdigitated with each other via a dielectric. That is, the first and second electrodes 110 and 210 are interdigitated with each other.

The tip portions of the teeth 105 to 109 of the first electrode 110 are electrically connected with a third electrode line 102 formed in a lower wiring layer as the second wiring layer different from the first wiring layer via vias 103. Likewise, the tip portions of the teeth 205 to 209 of the second electrode 210 are electrically connected with a fourth electrode line 202 formed in the lower wiring layer via vias 203.

The capacitor structure of FIG. 12 is different from the capacitor structure of FIG. 1 in the position of the base ends of the electrode lines at the comb electrodes from which the electrode lines extend. That is, assuming that the comb electrodes constitute a rectangle, while the electrode lines extend from the diagonally opposite corners of this rectangle in the capacitor structure of FIG. 1, the electrode lines extend from the center positions of the opposite sides of the rectangle in the capacitor structure of FIG. 12.

Also, in the capacitor structure of FIG. 12, the line width is not fixed but varied among the teeth 105 to 109 of the first electrode 110. In other words, the line width of each of the teeth 105 to 109 is wider as the distance between the base end of the tooth and the base end of the first electrode line 101 at the electrode base 104 is longer. Specifically, the line width of the tooth 107 nearest to the base end of the first electrode line 101 is narrowest, and the line widths of the teeth 105 and 109 farthest from the base end of the first electrode line 101 are widest. This also applies to the line widths of the teeth 205 to 209 of the second electrode 210.

By adjusting the line widths of the teeth in the manner described above, the resistance value can be roughly fixed among all the routes from the entrance to the exits of the comb electrode. Thus, the currents flowing through the routes of the comb electrode can be made roughly equal to one another. This configuration is therefore effective as a measure against migration.

In FIG. 12, the electrode lines extend from the center positions of the opposite sides of the rectangle made of the comb electrodes. The position of the base ends of the electrode lines is not limited to those shown in FIG. 12, but arbitrary positions may be set. In such cases, the line widths of the teeth of each comb electrode may be adjusted according to the position of the base end of the electrode line so that the resistance value is roughly fixed among all the routes from the entrance to the exits of the comb electrode. In other words, the line width may be narrowed if a high resistance value is desired and widened if a low resistance value is desired.

As described above, in this embodiment, the position of the base end of the electrode line at each comb electrode can be arbitrarily determined according to the layout of the integrated circuit. In this case, also, a measure against electromigration can be easily taken and, as in the capacitor structure of Embodiment 1, a large-capacity capacitor small in characteristic degradation can be attained.

According to the present invention, capacitors having satisfactory high-frequency characteristics can be provided, and thus the noise bypassing effect in a high-frequency range, for example, can be improved. Hence, the present invention is useful for capacitors for noise removal in a wide range of frequencies, such as bypass capacitors.

While the present invention has been described in preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. A capacitor structure formed on a semiconductor substrate, comprising:
   a first electrode line formed in a first wiring layer and having a first electrode base and a first extension extending from the first electrode base;
   a second electrode line formed in the first wiring layer and having a second electrode base and a second extension extending from the second electrode base;
   a third electrode line formed in a second wiring layer different from the first wiring layer;
   a first electrode having a plurality of teeth protruding in a comb shape from the first electrode base of the first electrode line; and
   a second electrode having a plurality of teeth protruding in a comb shape from the second electrode base of the second electrode line,
   wherein the first and second electrodes face each other with their teeth interdigitated with each other via a dielectric,
   all of the plurality of teeth of the first electrode protrude from the first electrode base, and all of the plurality of teeth of the second electrode protrude from the second electrode base,
   at least one of the plurality of teeth of the first electrode is electrically connected to the third electrode line, and
   the third electrode line extends across at least one of the plurality of teeth of the second electrode in a plan view.

2. The capacitor structure of claim 1, wherein the third electrode line comprises a third electrode base and a third electrode having a plurality of teeth protruding in a comb shape from the third electrode base of the third electrode line,
   wherein at least one of the teeth of the second electrode faces a corresponding one of the teeth of the third electrode.

3. The capacitor structure of claim 1, wherein vias are formed on top or bottom of the teeth of the first and second electrodes.

4. The capacitor structure of claim 2, wherein:
   the capacitor structure further comprises a fourth electrode line formed in the second wiring layer having a fourth electrode base, and
   a fourth electrode having a plurality of teeth protruding in a comb shape from the fourth electrode base of the fourth electrode line, wherein:
   the third and fourth electrodes face each other with their teeth interdigitated with each other via a dielectric,
   at least one of the teeth of the first electrode is connected with a corresponding one of the teeth of the third electrode via a via, and
   at least one of the teeth of the second electrode is connected with a corresponding one of the teeth of the fourth electrode via a via.

5. The capacitor structure of claim 1, wherein the line width of at least one of the teeth of the first electrode is different from the other teeth of the first electrode.

6. The capacitor structure of claim 5, wherein the line width of each of the teeth of the first electrode increases as a distance between the first extension and each of connecting point at which each of the teeth of the first electrode connect to the first electrode base increases.

7. A capacitor structure formed on a semiconductor substrate, comprising:
   a first electrode formed in a first wiring layer and having a first extension and a first spiral portion extending from the first extension;
   a second electrode formed in the first wiring layer and having a second extension and a second spiral portion extending from the second extension;
   a third electrode line formed in a second wiring layer different from the first wiring layer,
   wherein the first and second spiral portions face each other and are intertwined with each other via a dielectric, and
   the first spiral portion of the first electrode is electrically connected with the third electrode line so as to form a route of a current flow between the first extension and the third electrode line, and
   the third electrode line extends across at least one of a part of the first spiral portion of the first electrode and a part of the second spiral portion of the second electrode in a plan view.

8. The capacitor structure of claim 7, wherein the third electrode line comprises a third electrode base and a third electrode having a plurality of protrusions protruding from the third electrode base of the third electrode line,
   wherein at least part of the second spiral portion of the second electrode faces corresponding part of the protrusions of the third electrode.

9. The capacitor structure of claim 7, wherein vias are formed on top or bottom of the first and second spiral portions of the first and second electrodes.

10. The capacitor structure of claim 7, wherein;
    the capacitor structure further comprises a fourth electrode line formed in the second wiring layer having a fourth electrode base, the third electrode line comprises a third electrode base,
the second spiral portion of the second electrode is electrically connected with the fourth electrode line,
the capacitor structure further comprises:
- a third electrode having a plurality of protrusions protruding from the third electrode base of the third electrode line; and
- a fourth electrode having a plurality of protrusions protruding from the fourth electrode base of the fourth electrode line,
the third and fourth electrodes face each other with their protrusions interdigitated with each other via a dielectric,
the first spiral portion of the first electrode is connected with the protrusions of the third electrode via at least one via disposed on the first spiral portion, and
the second spiral portion of the second electrode is connected with the protrusions of the fourth electrode via at least one via disposed on the second spiral portion.

11. The capacitor structure of claim 1, wherein a via is disposed at a tip portion of the at least one of the teeth of the first electrode to electrically connect with the third electrode line.

12. The capacitor structure of claim 7, wherein a via is disposed at a tip portion of the first spiral portion of the first electrode to electrically connect with the third electrode line.

13. The capacitor structure of claim 1, wherein only one via is disposed at the at least one of the plurality of teeth of the first electrode to electrically connect with the third electrode line.

14. The capacitor structure of claim 7, wherein only one via is disposed at the first spiral portion of the first electrode.

15. The capacitor structure of claim 1, wherein the first electrode base and the first extension have no via to electrically connect with the third electrode line.

16. The capacitor structure of claim 10, wherein:
the first spiral portion of the first electrode is connected with the protrusions of the third electrode via a plurality of vias disposed on the first spiral portion, and
the second spiral portion of the second electrode is connected with the protrusions of the fourth electrode via a plurality of vias disposed on the second spiral portion.

17. The capacitor structure of claim 1, wherein the first extension extends in a direction perpendicular to the plurality of teeth of the first electrode.

18. The capacitor structure of claim 6, wherein the first extension extends in a direction parallel to the plurality of teeth of the first electrode and opposite to a direction in which the plurality of teeth of the first electrode extend.

19. The capacitor structure of claim 1 further comprising:
a fourth electrode line formed in the second wiring layer, wherein:
at least one of the plurality of the teeth of the second electrode is electrically connected to the fourth electrode line, and
the fourth electrode line extends across at least one of the plurality of teeth of the first electrode in a plan view.

20. The capacitor structure of claim 1, wherein
the third electrode line is disposed between the first electrode base and the second electrode base in a plan view.

21. The capacitor structure of claim 4, wherein:
the third electrode line is disposed between the second electrode base and the fourth electrode line in a plan view, and
the fourth electrode line is disposed between the first electrode base and the third electrode line in a plan view.

22. A capacitor structure formed on a semiconductor substrate, comprising:
a first electrode formed in a first wiring layer and having a first electrode base and a plurality of first teeth protruding in a comb shape from the first electrode base;
a second electrode formed in the first wiring layer and having a second electrode base and a plurality of second teeth protruding in a comb shape from the second electrode base;
a third electrode formed in a second wiring layer different from the first wiring layer, wherein the first and second teeth face each other by being interdigitated with each other via a dielectric,
at least one of the plurality of first teeth of the first electrode is electrically connected to the third electrode, and
the third electrode extends across at least one of the plurality of second teeth of the second electrode in a plan view.

23. The capacitor structure of claim 1, wherein:
the capacitor structure further comprises a fourth electrode line formed in the second wiring layer, and
the fourth electrode line extends across at least one of the plurality of teeth of the first electrode in a plan view.

24. The capacitor structure of claim 7, wherein:
the capacitor structure further comprises a fourth electrode line formed in the second wiring layer, and
the fourth electrode line extends across at least a part of the first spiral portion of the first electrode and a part of the second spiral portion of the second electrode in a plan view.

* * * * *